(12) United States Patent
Jia et al.

(10) Patent No.: US 9,099,661 B2
(45) Date of Patent: Aug. 4, 2015

(54) OFET INCLUDING PVDF-TRFE-CFE DIELECTRIC

(75) Inventors: Zhang Jia, Santa Clara, CA (US); Nadia Pervez, Houston, TX (US); Fabio Carta, Cagliari (IT); Ioannis Kymissis, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 14/110,022

(22) PCT Filed: Apr. 5, 2012

(86) PCT No.: PCT/US2012/032382
§ 371 (c)(1),
(2), (4) Date: Mar. 20, 2014

(87) PCT Pub. No.: WO2013/106021
PCT Pub. Date: Jul. 18, 2013

(65) Prior Publication Data
US 2014/0239274 A1    Aug. 28, 2014

Related U.S. Application Data

(60) Provisional application No. 61/472,979, filed on Apr. 7, 2011.

(51) Int. Cl.
*H01L 29/08* (2006.01)
*H01L 51/40* (2006.01)
(Continued)

(52) U.S. Cl.
CPC .......... *H01L 51/0096* (2013.01); *H01L 27/283* (2013.01); *H01L 51/05* (2013.01); *H01L 51/052* (2013.01); *H01L 2251/10* (2013.01); *Y02E 10/549* (2013.01)

(58) Field of Classification Search
CPC ... H01L 27/283; H01L 51/0096; H01L 51/05; H01L 2251/10
USPC ............ 257/40, 67, 69, 369; 438/82, 99, 152, 438/199
See application file for complete search history.

(56) References Cited

U.S. PATENT DOCUMENTS 6,852,416 B2 *   2/2005   Zhang et al. .................. 428/421
7,858,975 B2    12/2010   Kymissis
(Continued)

FOREIGN PATENT DOCUMENTS

WO   WO-2013106021 A1   7/2013

OTHER PUBLICATIONS

"International Application Serial No. PCT/US2012/032382, International Search Report and Written Opinion mailed Jul. 16, 2012", 74 pgs.

(Continued)

*Primary Examiner* — Hung Vu
(74) *Attorney, Agent, or Firm* — Schwegman Lundberg & Woesner, P.A.

(57) ABSTRACT

An organic electrical device can include a first dielectric substrate including a PVDF-TrFe-CFE terpolymer, a first semiconductor region coupled to a first surface of the first dielectric substrate, and a first gate region coupled to a second surface of the first dielectric substrate, the second surface opposite the first surface and opposite the first semiconductor region. The organic electrical device can include an organic field-effect transistor (OFET), comprising the first gate region, the first dielectric substrate, a first source region, and a first drain region respectively electrically coupled to the first semiconductor region. An electrostrictive actuator or mechanical sensor can be co-integrated on the first dielectric substrate, the actuator or sensor including first and second conductive regions located on opposite surfaces of the first dielectric substrate. The actuator or sensor can be electrically coupled to the OFET, and controlled at least in part by the OFET.

20 Claims, 11 Drawing Sheets

(51) Int. Cl.
*H01L 51/00* (2006.01)
*H01L 51/05* (2006.01)
*H01L 27/28* (2006.01)

(56) References Cited

U.S. PATENT DOCUMENTS

| | | | | |
|---|---|---|---|---|
| 7,868,320 | B2* | 1/2011 | Saito | 257/40 |
| 8,283,657 | B2 | 10/2012 | La Rosa et al. | |
| 8,552,623 | B2 | 10/2013 | Choi et al. | |
| 2005/0062066 | A1* | 3/2005 | Bao et al. | 257/202 |
| 2006/0019421 | A1* | 1/2006 | Jujii et al. | 438/52 |
| 2006/0208255 | A1* | 9/2006 | Mori et al. | 257/40 |
| 2008/0211032 | A1 | 9/2008 | Hooker et al. | |

OTHER PUBLICATIONS

"International Application Serial No. PCT/US2012/32382, International Search Report mailed Jul. 16, 2012", 2 pgs.
"International Application Serial No. PCT/US2012/323822, Written Opinion mailed Jul. 16, 2012", 4 pgs.
Qin, Chen, "The Optical and Dielectric Applications of Poly(Vinylidene Fluoride) Based Electro-Active Polymers", A Dissertation in Electrical Engineering, (2008).
"International Application Serial No. PCT/US2012/032382, International Preliminary Report on Patentability mailed Oct. 17, 2013", 6 pgs.
"Sensors & Gauges—Ktech Corporation", [online]. [archived on May 3, 2009], Retrieved from the Internet: <URL: https://web.archive.org/web/20090503055834/http://www.ktech.com/featured_products/sensors_gauges.cfm>, (2009), 2 pgs.
Bauer, F., et al., "Recent advances in highly electrostrictive P(VDF-TrFE-CFE) terpolymers", *IEEE Transactions on Dielectrics and Electrical Insulation*, 13(5), (Oct. 2006), 1149-1154.
Dahiya, R. S, et al., "Piezoelectric oxide semiconductor field effect transistor touch sensing devices", *Appl. Phys. Lett.*, 95, (2009), 034105-1-034105-3.
Madden, John D. W., et al., "Artificial Muscle Technology: Physical Principles and Naval Prospects", *IEEE Journal of Oceanic Engineering*, 29(3), (Jul. 2004), 706-728.
Basirico, Laura, et al., "Inkjet printing of transparent, flexible, organic transistors", Thin Solid Films, vol. 520, (2011), 1291-1294.
Bauer, F., et al., "Recent Advances in Highly Electrostrictive P(VDF-TrFE-CFE) Terpolymers", (Oct. 2006), 1129-1134.
Cheng, Z.-Y., et al., "Electrostrictive poly(vinylidene fluoride-trifluoroethylene) copolymers", Sensors and Actuators A90, (2001), 138-147.
Dahiya, Ravinder S., et al., "Piezoelectric Polymer Oxide Semiconductor Field Effect Transistor (POSFET) Devices for Touch Sensing", 2009 2nd International Workshop on Electron Devices and Semiconductor Technology, (2009), 1-5.
Fortunato, Elvira, et al., "High-Performance Flexible Hybrid Field-Effect Transistors Based on Cellulose Fiber Paper", IEEE Electron Device Letters, vol. 29, No. 9, (Sep. 2008), 988-990.

Graz, Ingrid, et al., "Flexible ferroelectret field-effect transistor for large-area sensor skins and microphones", Applied Physics Letters, vol. 89, No. 7, (Aug. 14, 2006), 073501-073501-3.
Huang, Cheng, et al., "Poly(vinylidene fluoride-trifluoroethylene) Based High Performance Electroactive Polymers", IEEE Transactions on Dielectrics and Electrical Insulation, vol. 11, No. 2, (Apr. 2004), 299-311.
Jia, Zhang, et al., "Laboratory pentacene and parylene evaporation systems for fabricating organic thin film devices", Journal of Vacuum Science and Technology B, 2nd Series, vol. 29, No. 2, (Apr. 2011), 022401-5.
Jung, Soon-Won, et al., "Top-gate ferroelectric thin-film-transistors with P(VDF-TrFE) copolymer", Current Applied Physics 10, (2010), e58-e61.
Lacour, Stephanie P., et al., "Design and Performance of Thin Metal Film Interconnects for Skin-Like Electronic Circuits", IEEE Electron Device Letters, vol. 25, No. 4, (Apr. 2004), 179-181.
Lacour, Stephanie P., et al., "Stretchable gold conductors on elastomeric substrates", Applied Physics Letters, vol. 82, No. 15, (2003), 2404-2406.
Lee, Kwang H., et al., "High-Mobility Nonvolatile Memory Thin-Film Transistors with a Ferroelectric Polymer Interfacing ZnO and Pentacene Channels", Advanced Materials 21, (2009), 4287-4291.
Levard, Thomas, et al., "Core-free rolled actuators for Braille displays using P(VDF-TrFE-CFE)", Smart Materials and Structures—Systems from nano-to macroscale, vol. 21, No. 1, (Jan. 2012), 1-7.
Ng, Tse Nga, et al., "Electrical Stability of inkjet-patterned organic complementary inverters measured in ambient conditions", Applied Physics Letters 94, (2009), 233307-233307-3.
Park, Sung Kyu, et al., "High Mobility solution processed 6,13-bis(triisopropyl-silylethynyl) pentacene organic thin film transistors", Applied Physics Letters 91, (Aug. 6, 2007), 063514-1 to 3.
Ren, Kailiang, et al., "A Compact Electroactive Polymer Actuator Suitable for Refreshable Braille Display", Proceedings of SPIE, vol. 6524, (Mar. 2007), 65241G-1 to 65241G-9.
Shin, S., et al., "Solution-processed 6,13-bis(triisopropylsilylethynyl) (TIPS) pentacene thin-film transistors with a polymer dielectric on a flexible substrate", Semiconductor Science and Technology, vol. 23, No. 8, (Aug. 2008), 1-4.
Xia, Feng, et al., "High Performance P(VDF_TrFE-CFE) Terpolymer for BioMEMs and Microfluidic Devices", Materials Research Society Symposium Proceedings, vol. 785, (2004), 131-138.
Xu, T.-B., et al., "High-Performance micromachined unimorph actuators based on electrostrictive poly(vinylidene fluoride-trifluoroethylene) copolymer", Applied Physics Letters, vol. 80, No. 6, (Feb. 11, 2002), 1082-1084.
Zhang, Q. M., et al., "Giant Electrostriction and Relaxor Ferroelectric Behavior in Electron-Irradiated Poly(vinylidene fluoride-trifluoroethylene) Copolymer", Science, vol. 280, [Online]. Retrieved from the Internet: <URL: www.sciencemag.org, (Jun. 26, 1998).

* cited by examiner

OFET INCLUDING PVDF-TRFE-CFE DIELECTRIC

CLAIM OF PRIORITY

This application is a U.S. National Stage Application filed under 35 U.S.C. §371 of International Application Serial No. PCT/US2012/032382, titled "OFET INCLUDING PVDF-TRFE-CFE DIELECTRIC," filed on 5 Apr. 2012, and published on 18 Jul. 2013 as WO 2013/106021, which claims the benefit of priority to U.S. Provisional Patent Application Ser. No. 61/472,979, titled "OFET INCLUDING PVDF-TRFE-CFE DIELECTRIC," filed on Apr. 7, 2011, the benefit of priority of each of which is hereby presently claimed, and each of which is hereby incorporated by reference herein in its respective entirety.

BACKGROUND

Field-Effect Transistors (FETs) can include a range of transistor topologies in which charge carriers can flow between a source region and drain region, such as controlled by a voltage applied between a gate region and the source region. FETs can be used in analog or digital applications, such as included as a portion of a monolithic integrated circuit. In one approach, one or more FETs can be fabricated using an inorganic group IV semiconductor (e.g., silicon), or using a compound semiconductor (e.g., groups III-V, or II-V). Inorganic semiconductor devices can be used for very large scale integration (VLSI), such as for complex digital systems including communications circuits, microprocessors, or memories, for example.

OVERVIEW

Organic FETs (OFETs) can use organic materials (e.g., polymers) as semiconductors, rather than inorganic materials such as silicon. Use of organic materials can provide one or more characteristics unavailable in silicon-based or other inorganic devices, such as improved optical transparency, reduced thickness, or the ability to mechanically bend or flex. In contrast to FETs that use inorganic semiconductors, OFETs can be deposited or patterned at room temperature using low-cost techniques, making OFETs economical to fabricate for large-area electronic applications such as digital displays or sensor arrays.

In one approach, an OFET can include silicon dioxide ($SiO_2$) or layers of $SiO_2$ and one or more other materials as a gate dielectric. However, such a dielectric layer can increase fabrication cost or complexity, or can compromise an ability of such an OFET to flex. The present inventors have recognized, among other things, that an OFET can include a dielectric layer of P(VDF-TrFE-CFE) (a copolymer of vinylidene fluoride, trifluoroethylene, and chlorofluoroethylene, also abbreviated PVDF-TrFE-CFE) as a gate dielectric without requiring an $SiO_2$ layer.

In an OFET, various dielectric materials can be used, such as can include one or more ferroelectric or paraelectric polymers. For example, adding CFE to the ferroelectric material P(VDF-TrFE) can reduce its Curie temperature to below room temperature, thus the -CFE material exhibits mainly paraelectric phase at room temperature. Compared to ferroelectric P(VDF-TrFE), the -CFE terpolymer has several advantages, including little or no hysteresis during polarization. Because PVDF-TrFE-CFE is generally not ferroelectric at room temperature, there is no need to expend energy switching the polarization of the material. For example, by including the -CFE imperfections in the polymer, the long range correlation between polar groups can be broken.

In an example, an apparatus, such as an organic electrical device, can include a first dielectric substrate including a PVDF-TrFe-CFE terpolymer, a first semiconductor region coupled to a first surface of the first dielectric substrate, and a first gate region coupled to a second surface of the first dielectric substrate, the second surface opposite the first surface and opposite the first semiconductor region. For example, the organic electrical device can include an organic field-effect transistor (OFET), comprising the first gate region, the first dielectric substrate, a first source region, and a first drain region respectively electrically coupled to the first semiconductor region.

In an example, an electrostrictive actuator or a mechanical sensor can be co-integrated with the OFET on the first dielectric substrate, the actuator or the sensor including first and second conductive regions located on opposite surfaces of the first dielectric substrate. The actuator or the sensor can be electrically coupled to the OFET, and controlled at least in part by the OFET.

In an illustrative example, such an OFET can be included as a portion of a thin-film device for robot motion or other actuation including PVDF-TrFE-CFE both as the dielectric in an OFET and as an electrostrictive material that can produce motion. Such dual use of the terpolymer can simplify fabrication of electronic devices containing electrostrictive material. Other applications can include devices that use electrostrictive materials (e.g., artificial muscles, actuators, sensing devices, or including one or more other applications).

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1A:
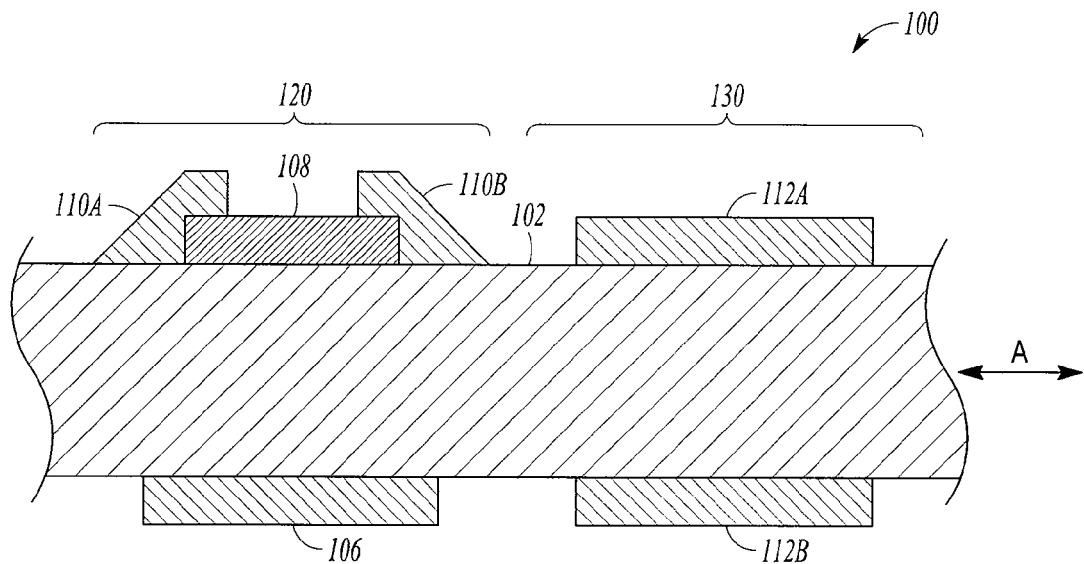
FIG. 1A illustrates generally an example of a section view of an apparatus that can include an OFET and a transducer.

FIG. 1A illustrates generally an example of a section view of an apparatus 100 that can include an OFET 120 (e.g., a thin-film transistor) and a transducer 130. A dielectric substrate 102 can include a PVDF-TrFE-CFE terpolymer, such as including a sheet or film configuration, or one or more other materials. A semiconductor region 108 can be mechanically coupled to the dielectric substrate 102, such as on a first surface of the dielectric substrate 102. A gate region 106 can be mechanically coupled to the dielectric substrate 102, such as opposite the semiconductor region 108, on a second surface of the dielectric substrate. In this manner, the dielectric substrate 102 can function both as a gate dielectric and as a mechanical substrate for the OFET 120. Such a dielectric substrate 102 can be referred to as an "interstrate" configuration. One or more source or drain regions can be electrically and mechanically coupled to the semiconductor region 108, such as can include a source region 110A or a drain region 110B.

The OFET 120 of FIG. 1A need not include silicon or other inorganic materials for the dielectric substrate 102 or the semiconductor region 108. For example, the semiconductor region 108 can include a pentacene layer to provide a p-channel conductivity type, or a fluorinated copper-pthalocyanine layer (e.g., $F_{16}CuPC$) to provide an n-channel conductivity type. The dielectric substrate 102 can provide a gate dielectric material conductively isolating the gate from the semiconductor region 108. Such a dielectric substrate 102, including PVDF-TrFE-CFE, can be mechanically flexible, such as allowing flexing of the substrate 102 and OFET 120 without damaging or inhibiting operation of the OFET 120.

The transducer 130 can include at least a portion of the dielectric substrate 102, such as a portion of the substrate 102 located between a first conductive region 112A and a second conductive region 112B. The transducer 130 can include an electrostrictive actuator, such as configured to expand or to contract axially along a portion of the dielectric substrate 102 (e.g., along an axial direction, "A"), or configured to bend away from such an axial direction, "A" (e.g., in a unimorph cantilevered configuration), such as in response to an applied voltage across the first and second conductive regions 112A through 112B. The transducer 130 can include a sensor, such as a mechanical strain sensor, such as configured to provide a voltage across the first and second conductive regions 112A through 112B in response to an applied strain or an applied bending moment. The mechanical transducer 130 can comprise a dielectric substrate 102 including or more materials, such as a pyroelectric or piezoelectric film, such as PVDF-TrFE, PVDF-TrFe-CFE, PVDF-TrFE-CTFE, or one or more other materials. Generally, the mechanical transducer 130 can include an electrostrictive dielectric substrate 102. For example, PVDF-TrFE-CFE comprises a relaxor electrostrictive polymer.

Figure 1B:
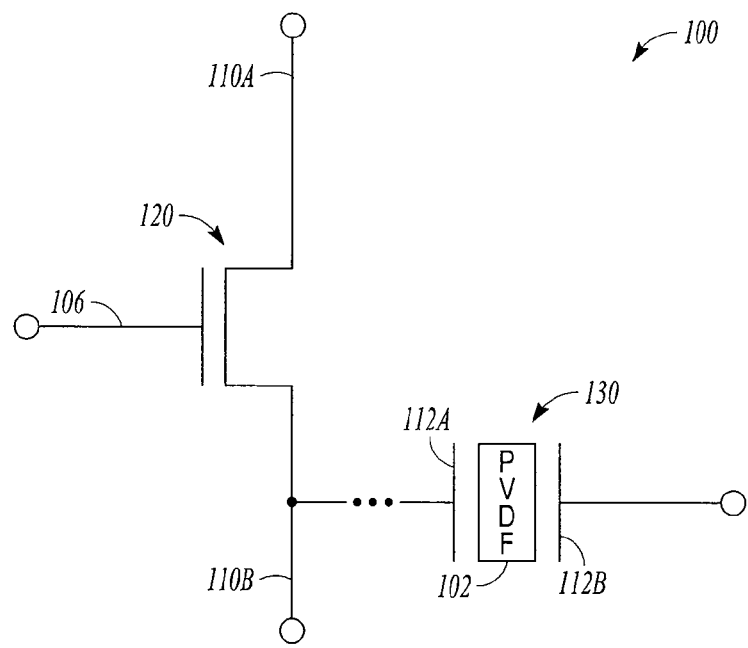
FIG. 1B illustrates generally an example of schematic view of an apparatus that can include an OFET and a transducer.

FIG. 1B illustrates generally an example of schematic view of an apparatus 100 that can include an OFET 120 and a transducer 130, such as including the configuration shown in the example of FIG. 1A. A gate 106 can be used to control a conduction state of the OFET 120, such as to controllably connect a source 110B to a drain 110A of the OFET 120. The drain 110A can be connected to a first specified node, such as a voltage source. For example, the voltage source can provide a voltage that is positive with respect to a reference potential (e.g., a "ground" or a common node). The source 110B can be connected to a second specified node, such as including the reference potential or a voltage source that is negative with respect to the first specified node.

Figure 2A:
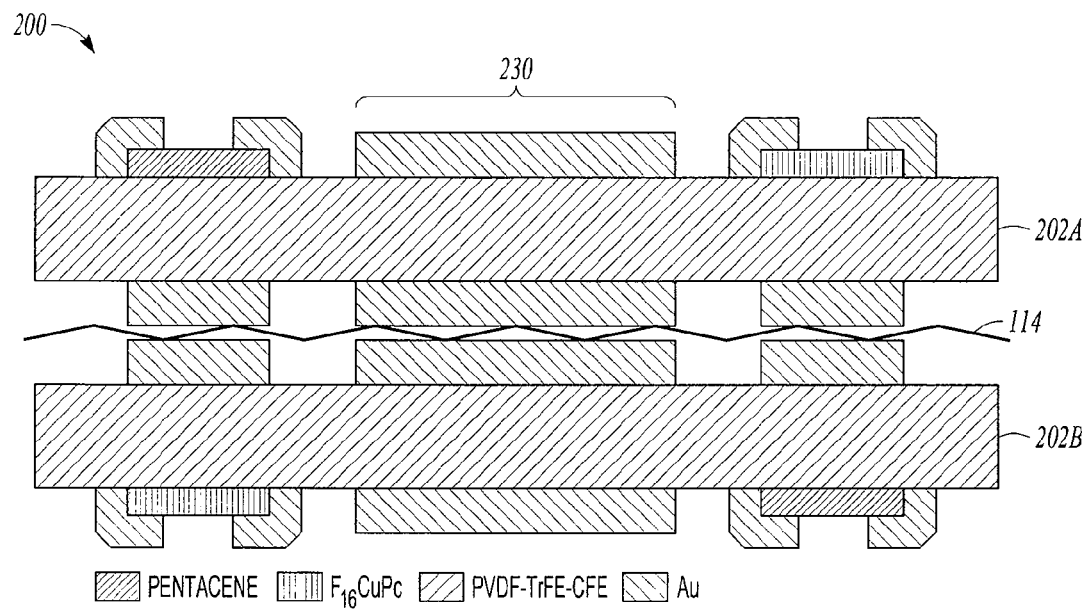
FIG. 2A illustrates generally an example of a section view of an apparatus that can include a complementary OFET pair and a transducer.
Figure 2B:
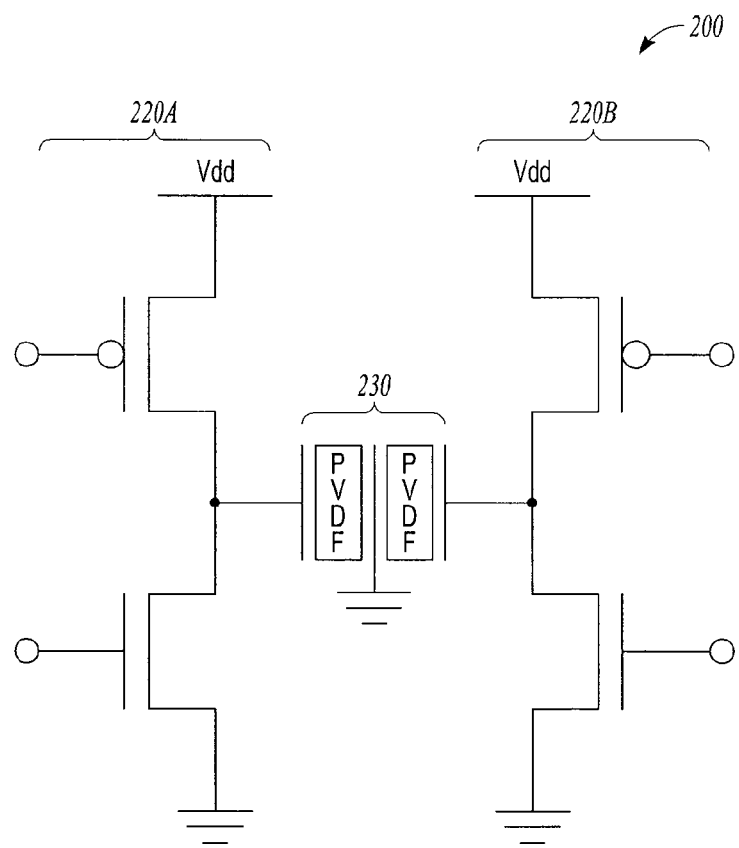
FIG. 2B illustrates generally an example of a schematic view of an apparatus that can include a complementary OFET pair and a transducer.

In an example, the source 110B can be electrically coupled to a first conductive region 112A of the transducer 130. For example, the source 110B and the first conductive region 112A can include a shared conductive or metalized region on the dielectric substrate 102 shown in FIG. 1A. A second conductive region 112B can be electrically coupled to one or more other devices, such as another transducer (e.g., as shown in the examples of FIGS. 2A through 2B), another active device such as an OFET, or to a specified node such as the reference potential (e.g., the "ground" or common node). For example, one or more other devices can include a capacitor. The relative dielectric constant of PVDF-TrFE-CFE, of about 45 or more, can be used to provide a compact capacitor configuration. In an illustrative example, the mechanical transducer 130 can provide a capacitive mechanical sensor, such as a strain sensor. For example, other circuitry co-integrated on the dielectric substrate 102 can be used to condition, excite, monitor, or amplify one or more signals such as generated, provided, or modulated by the mechanical transducer 130, such as for sensing a strain imparted on a portion of the apparatus 100.

FIG. 2A illustrates generally an example of a section view of an apparatus 200 that can include a complementary OFET pair, such as a first complementary OFET pair comprising a first dielectric layer 202A (e.g., a first dielectric substrate), such as corresponding to a first complementary transistor pair 220A as shown in FIG. 2B, a second complementary OFET pair comprising a second dielectric layer 202B (e.g., a second dielectric substrate), such as corresponding to a second complementary transistor pair 220B as shown in FIG. 2B, and a transducer 230. FIG. 2B illustrates generally an example of a schematic view of the apparatus 200.

In the example of FIGS. 2A and 2B, the mechanical transducer 230 can include a sandwiched configuration of two (or more) mechanical transducers such as shown in the example of FIGS. 1A and 1B, such as to provide a mechanical sensor or actuator including a bimorph configuration, such as shown schematically in the example of FIG. 2B. In another approach, the second dielectric layer 202B can be inactive, and the first dielectric layer 202A can be active, such as to provide a unimorph transducer configuration, with clamping provided by the second dielectric layer 202B (or another layer adhered or otherwise bonded to the first dielectric layer 202A, such as a polyimide layer or other material).

The first and second dielectric layers 202A and 202B can be laminated together, such as using an adhesive layer 114. Such an adhesive layer 114 can be displaced, such as during compression of a stackup including the first and second dielectric layers 202A and 202B, providing conductor-to-conductor contact between conductive regions on respective inside-facing surfaces of the first and second dielectric layers 202A and 202B. The mechanical transducer 230 can be controlled using one or more of the first or second complementary transistor pairs 220A or 220B.

In an illustrative example, a PVDF-TrFE-CFE layer, such as including one or more of the dielectric substrate 102 of FIGS. 1A through 1B, 202A, or 202B of FIGS. 2A through 2B, can be obtained from Strategic Polymer Sciences, Inc.

(Pennsylvania, USA), such as including an average thickness of about 5 micrometers (μm). Such an illustrative example of a PVDF-TrFE-CFE layer can provide strain of up to about 2.5% or more (e.g., corresponding to an applied voltage of about 100 V per μm of displacement), a Young's modulus can be about 700 megapascals (MPa) or more, a relative dielectric constant of about 45 or more, a dielectric loss percentage of about 5% or less (e.g., corresponding to a dielectric loss tangent of about 0.05), and a minimum layer thickness of about 3 μm, or including one or more other layer thicknesses.

In an illustrative example of a p-channel FET, the semiconductor region 108 of FIG. 1A, or one of the FETs included in a complementary pair such as the first complementary pair 220A or the second complementary pair 220B, can include an evaporatively deposited layer of pentacene including a thickness of about 30 nanometers (nm). In an illustrative example of an n-channel FET, the semiconductor region 108 of FIG. 1A, or one of the FETs included in a complementary pair such as the first complementary pair 220A or the second complementary pair 220B, can include an evaporatively deposited layer of $F_{16}CuPC$ of about 30 nm. One or more of the pentacene or the $F_{16}CuPC$ can be obtained, for example, from Luminescence Technology Corporation (a/k/a "Lumtec," Taiwan, Republic of China). In an illustrative example, the dielectric substrate can be stretched before evaporative deposition of one or more semiconductor regions, such as to enhance smoothness or planarity of the dielectric substrate before deposition or other fabrication techniques.

One or more conductive regions, such as the gate 106, the source region 110A, drain region 110B, first conductive region 112A, or second conductive region 112B can include a metallic conductor. For example, such conductive regions can include gold or one or more other conductive species, such as including a thermally evaporatively deposited gold layer including about 40 nm thickness.

Other materials can be used for the dielectric substrate, such as one or more ferroelectric or paraelectric polymers. For example, P(VDF-TrFe) can be used, such as providing a corresponding reduction in exhibited electrostrictive strain, relative dielectric constant, or dielectric breakdown voltage.

Figure 3:
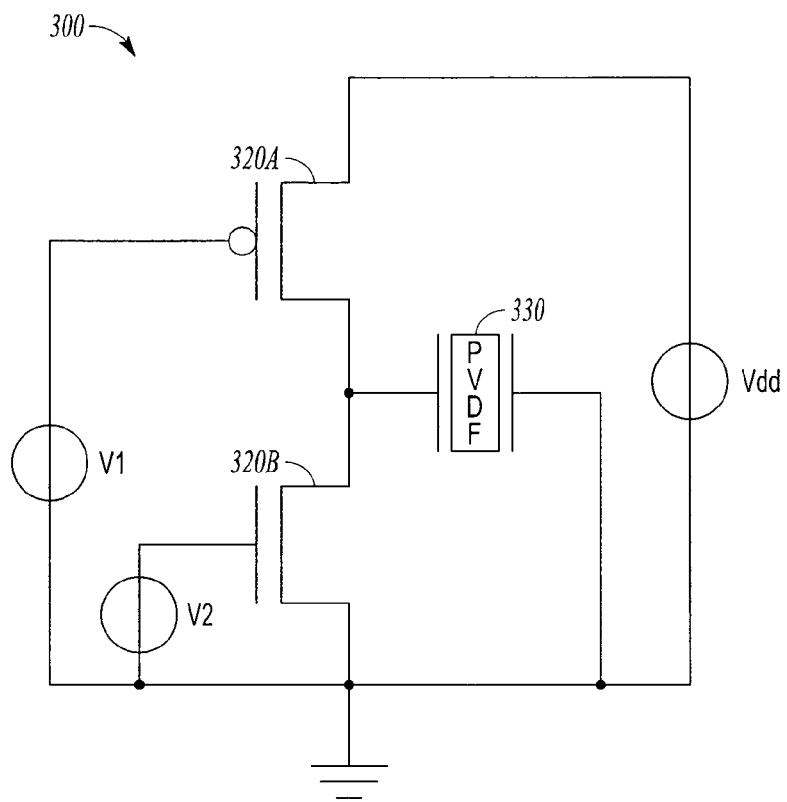
FIG. 3 illustrates generally a schematic view of an illustrative example of an electrical configuration that can be used to control an electrostrictive actuator.

FIG. 3 illustrates generally a schematic view of an illustrative example 300 of an electrical configuration that can be used to control an electrostrictive actuator 330, such as including one or more transistors or actuators as shown in the examples of FIG. 1A, 1B, 2A or 2B, or below. In an illustrative example, the mechanical actuator 330 can include a PVDF-TrFE-CFE electrostrictive dielectric material, a first transistor 320A can include a p-channel OFET, and a second transistor 320B can include an n-channel OFET.

One or more of the first transistor 320A or the second transistor 320B can include a gate dielectric interstrate configuration comprising a portion of a PVDF-TrFe-CFE dielectric layer that can be commonly-shared with the mechanical actuator 330. In an illustrative p-channel example, the first transistor 320A can include a pentacene semiconductor material, such as including a gate-to-source threshold voltage of about −4V. In an n-channel example, the second transistor 320B can include a $F_{16}CuPC$ semiconductor material, such as including a gate-to-source threshold voltage of about 10V. In an illustrative example, the mechanical actuator 330 can be controlled such as via applying a plus-or-minus 30V gate control voltage to a respective transistor, such as to switch a VDD voltage of about 300V across the transducer. The second transistor 320B can be used to deplete any stored charge from the mechanical transducer 330, such as to mechanically relax the actuator.

Figure 4A:
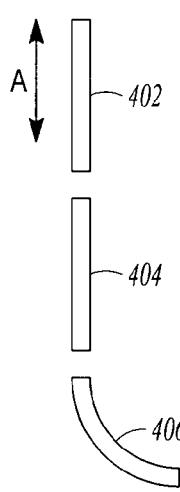
FIGS. 4A through 4C illustrate an illustrative example of an actuator assembly that can include respective electrostrictive actuators.
Figure 4B:
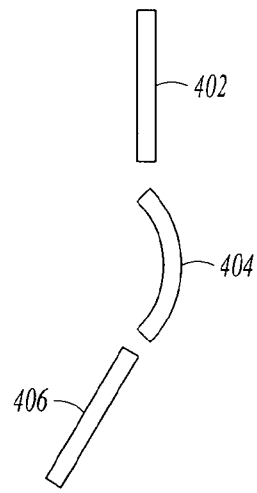
Figure 4C:
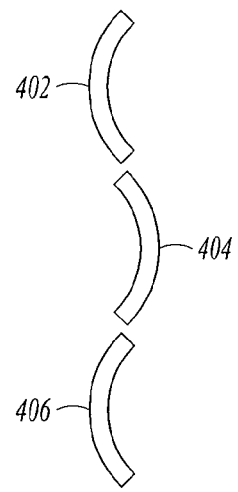

FIGS. 4A through 4C illustrate generally an illustrative example of an actuator assembly that can include one or more respective electrostrictive actuators, such as first actuator segment 402, a second actuator segment 404, or a third actuator segment 406. In an illustrative example, one or more of the actuator segments 402, 404, or 406 can include an electrostrictive actuator such as in a bimorph configuration as shown in the example of FIGS. 2A and 2B, or in one or more other examples. The one or more actuator segments 402, 404, or 406 can be driven with one or more co-integrated OFETs, such as to individually address or control one or more respective segments.

In the example of FIG. 4A, the third segment 406 can be actuated in a first direction, such as bending away from an axial direction, "A," of one or more of the first or second segments 402 or 404. In the example of FIG. 4B, the second segment 404 can be actuated to bend, such as rotating the third segment 406 away from the axial direction, "A." In the example of FIG. 4C, the first, second, and third segments 402, 404, and 406 can be actuated such as to compress the assembly in the axial direction, "A." The present inventors have recognized, among other things, that an actuator assembly such as including one or more integrated control circuits (e.g., one or more OFETs using an electrostrictive layer as a dielectric or interstrate layer) can be used for artificial muscle, robotics, or sensing applications, among other applications. As shown in the illustrative examples of FIGS. 4A through 4C, such an actuator assembly can be fabricated to swim, crawl, or climb, or for use such as in positioning or carrying one or more sensors, displays, or other actuators.

FIGS. 5A through 5F illustrate generally illustrative examples of experimentally-obtained transistor characteristics of a p-channel OFET, labeled "TFT 1," such as including a pentacene semiconductor material, such OFET fabricated and configured according to the illustrative examples discussed in relation to FIG. 1A, 1B, 2A or 2B, such as including a width, "W" of about 2000 μm and a length, "L" of about 100 μm.

Figure 5B:
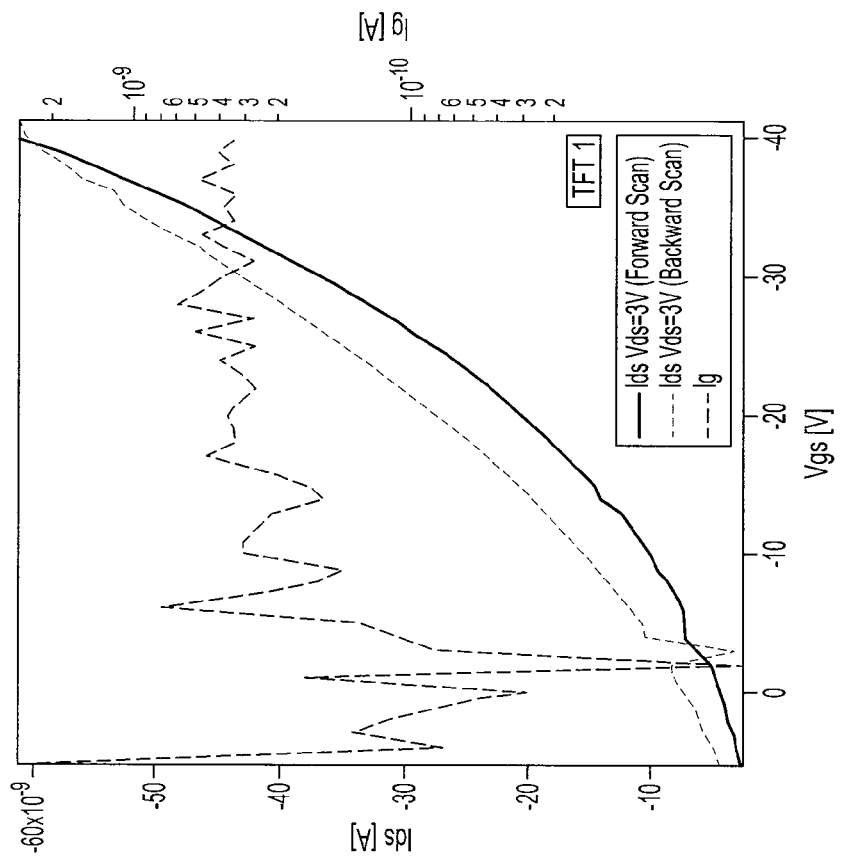
FIGS. 5A through 5F illustrate generally illustrative examples of experimentally-obtained transistor characteristics of an n-channel OFET.
Figure 5A:
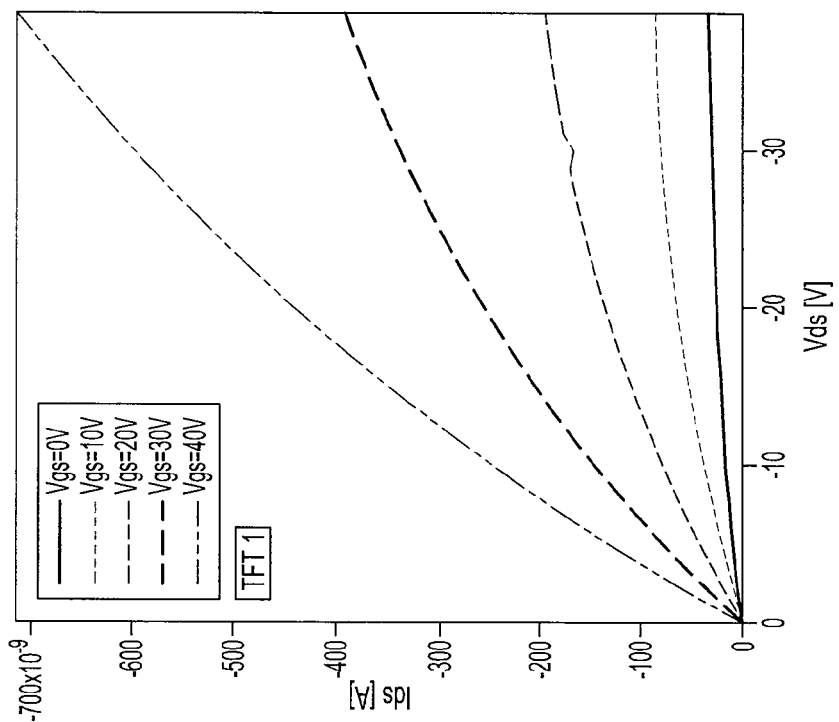

FIGS. 5A and 5B illustrate respectively in FIG. 5A a drain-to-source current $I_{ds}$ (A) versus drain-to-source voltage $V_{ds}$ (V), and in FIG. 5B a drain-to-source current $I_{ds}$(A), and gate-to-source leakage current $I_{gs}$ (A), versus an applied gate-to-source voltage $V_{gs}$ (V).

Figure 5D:
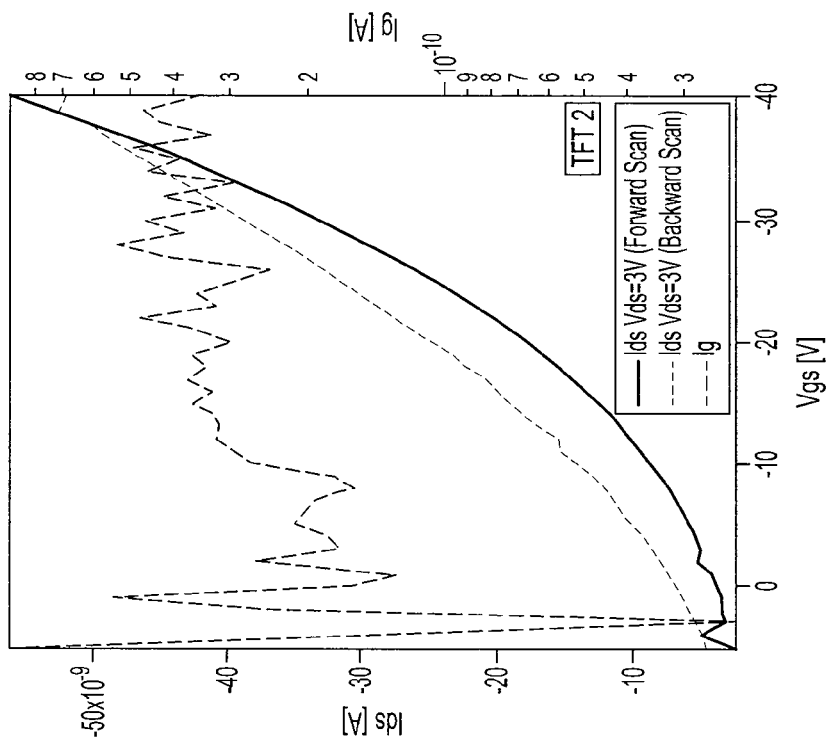
Figure 5C:
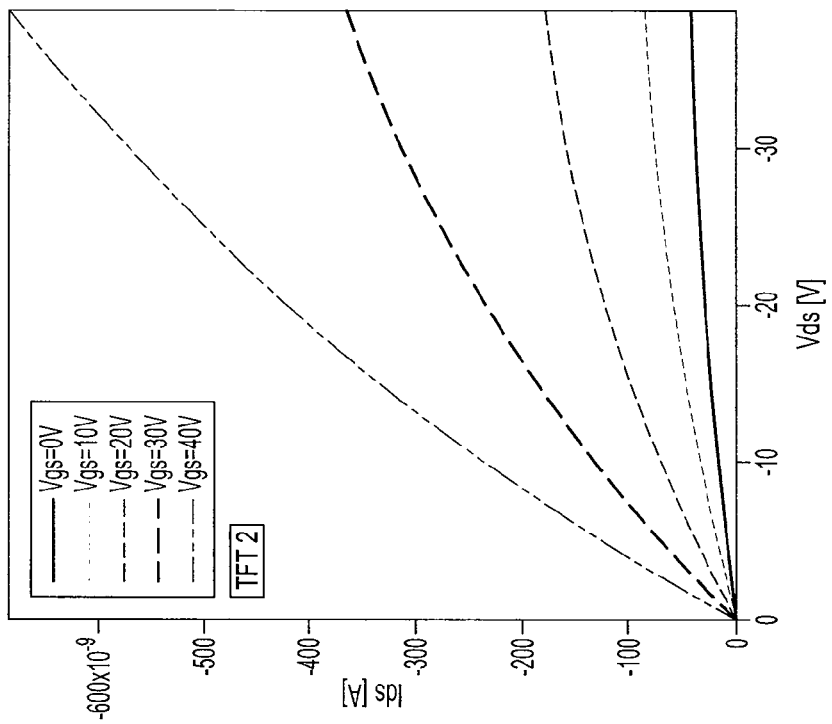
Figure 5F:
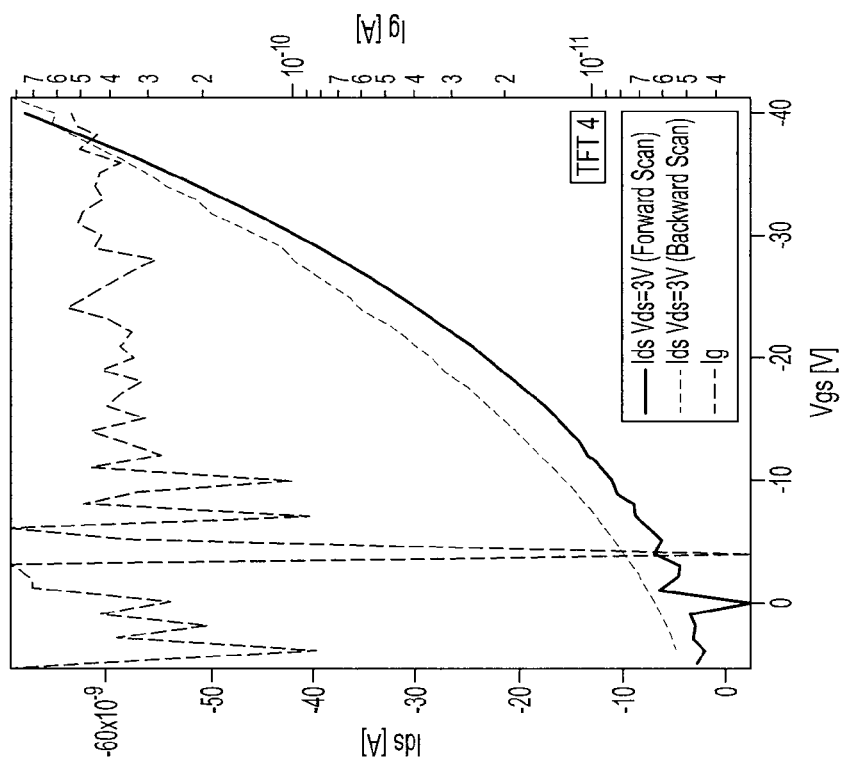
Figure 5E:
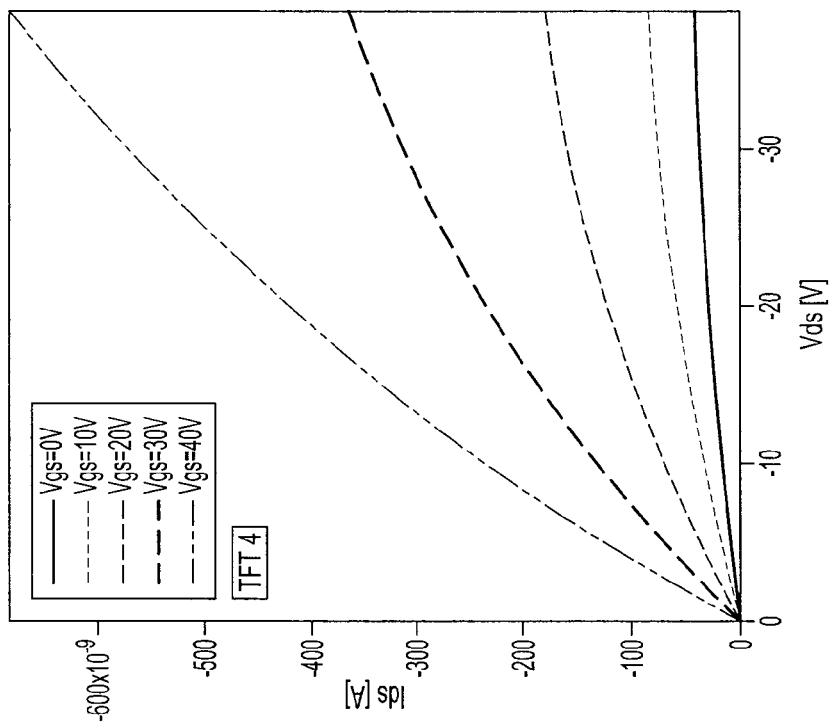

FIGS. 5C and 5D illustrate generally an illustrative example of a p-channel OFET similar to the one described in FIGS. 5A and 5B, but labeled "TFT 2." FIGS. 5E and 5F illustrate generally an illustrative example of a p-channel OFET similar to the one described in FIGS. 5A and 5B, but labeled "TFT 4."

Figure 6B:
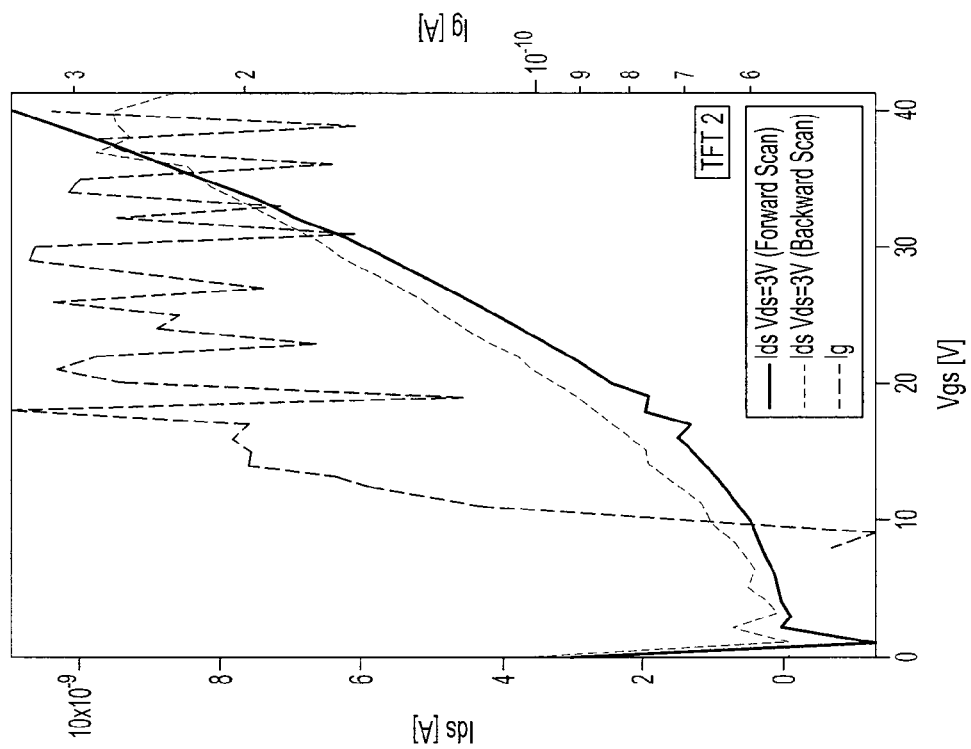
FIGS. 6A through 6F illustrate generally illustrative examples of experimentally-obtained transistor characteristics of a p-channel OFET.
Figure 6A:
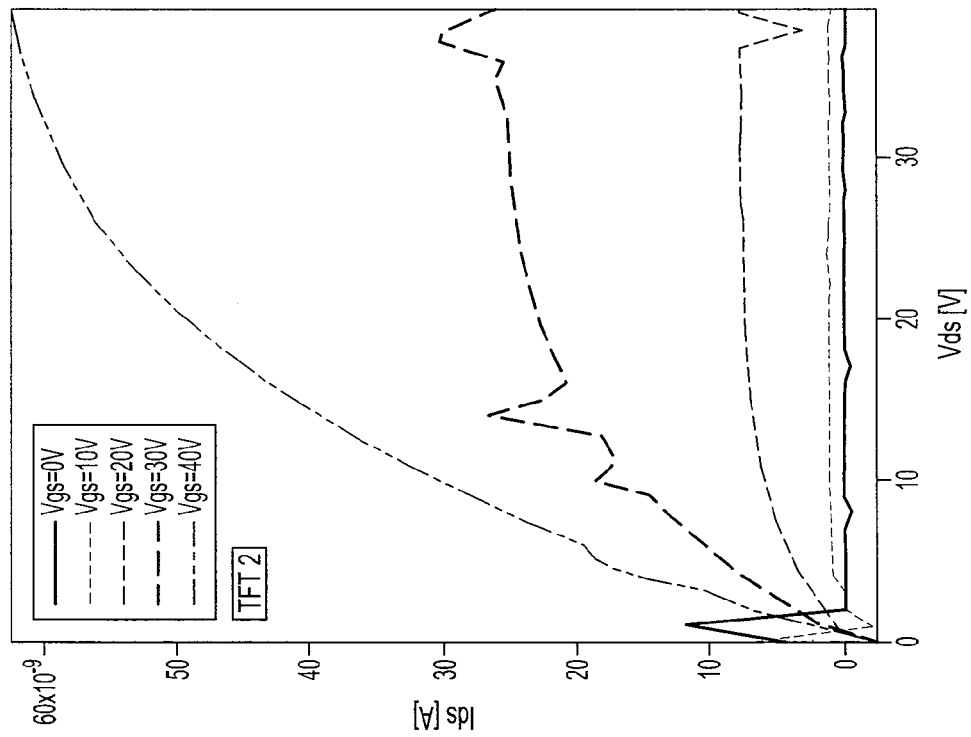

FIGS. 6A through 6F illustrate generally illustrative examples of experimentally-obtained transistor characteristics of an n-channel OFET, labeled "TFT 2," such as including a $F_{16}CuPC$ semiconductor material, such OFET fabricated and configured according to the illustrative examples discussed in relation to FIG. 1A, 1B, 2A or 2B, such as including a width, "W" of about 2000 μm and a length, "L" of about 100 μm. FIGS. 6A and 6B illustrate respectively in FIG. 6A a drain-to-source current $I_{ds}$ (A) versus drain-to-source voltage $V_{ds}$ (V), and in FIG. 6B a drain-to-source current $I_{ds}$(A), and gate-to-source leakage current $I_{gs}$ (A), versus an applied gate-to-source voltage $V_{gs}$ (V).

Figure 6D:
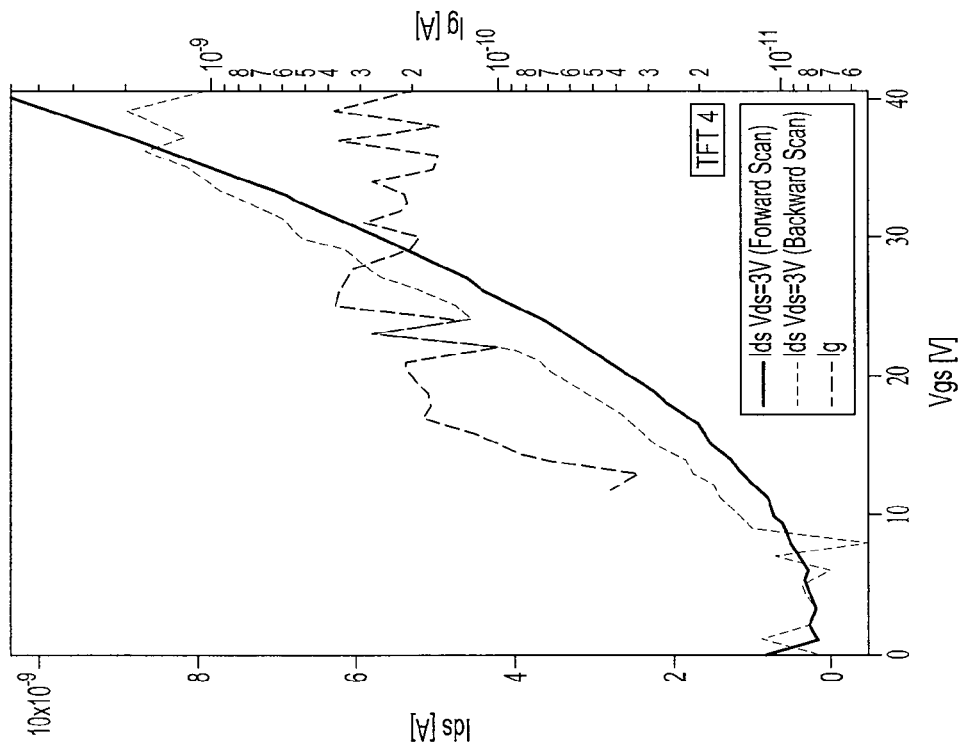
Figure 6C:
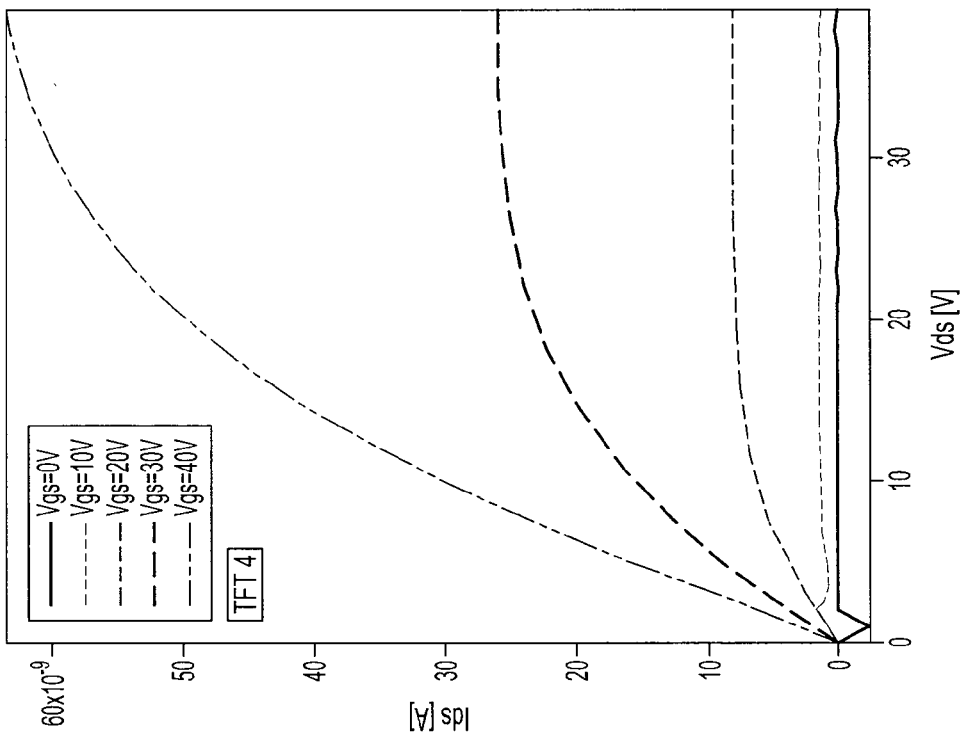
Figure 6F:
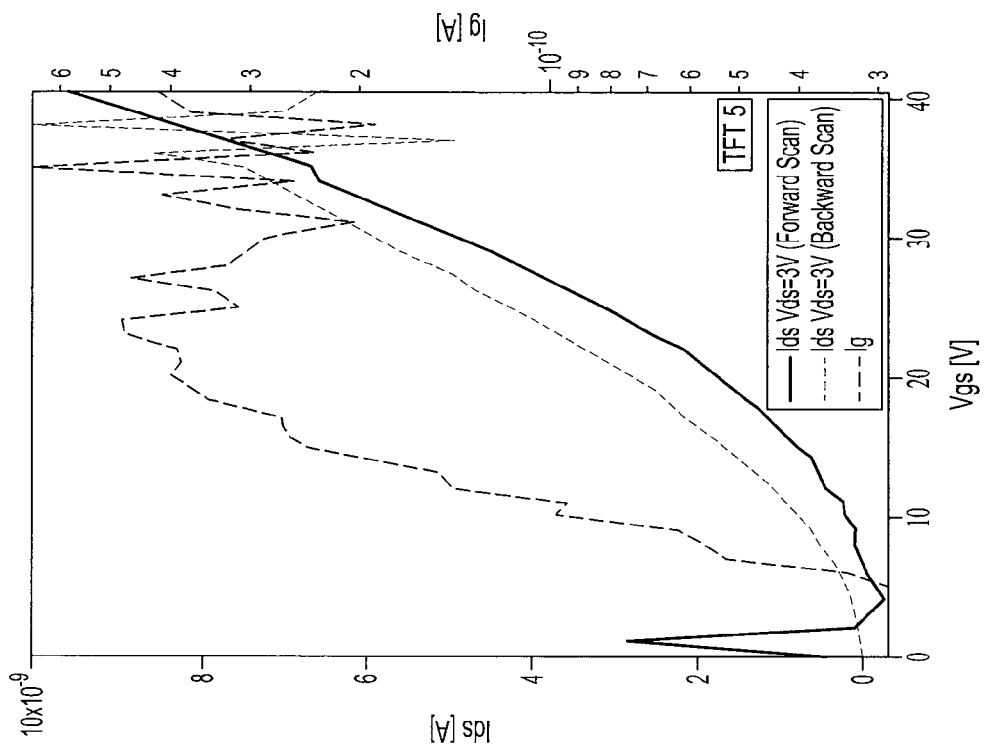
Figure 6E:
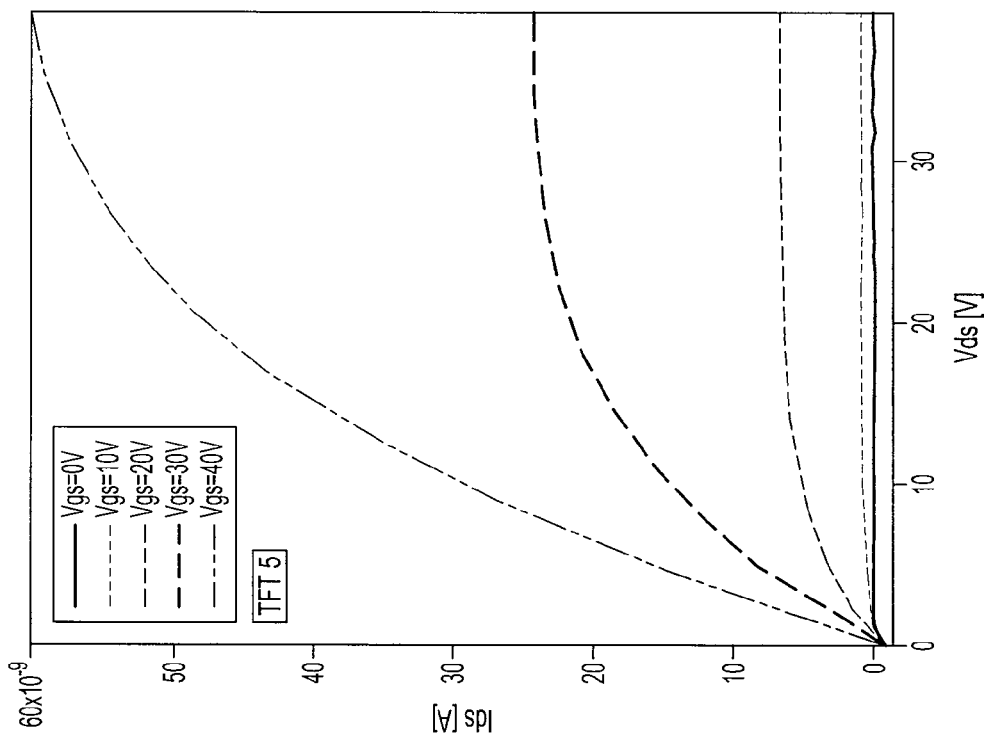

FIGS. 6C and 6D illustrate generally an illustrative example of an n-channel OFET similar to the one described in FIGS. 6A and 6B, but labeled "TFT 4." FIGS. 6E and 6F illustrate generally an illustrative example of an n-channel OFET similar to the one described in FIGS. 6A and 6B, but labeled "TFT 5."

The transistor characteristics shown in the n-channel and p-channel examples of FIGS. 5A through 5F and FIGS. 6A through 6F can exhibit carrier mobilities on the order of 0.1 centimeters squared per volt-second (cm$^2$/V·s), an $I_{on}$-to-$I_{off}$ ratio of about $10^4$ to $10^5$, and a maximum leakage current on the order of about $5 \times 10^{-8}$ A. In the illustrative examples of FIGS. 5B, 5D, 5F, 6B, 6D, and 6F, the gate voltage was scanned forward and backward, and the similarity of the shape and magnitude of the resulting drain-to-source currents illustrates generally that PVDF-TrFE-CFE does not exhibit a significant hysteretic property, in contrast to a PVDF-TrFE copolymer lacking -CFE.

Figure 7C:
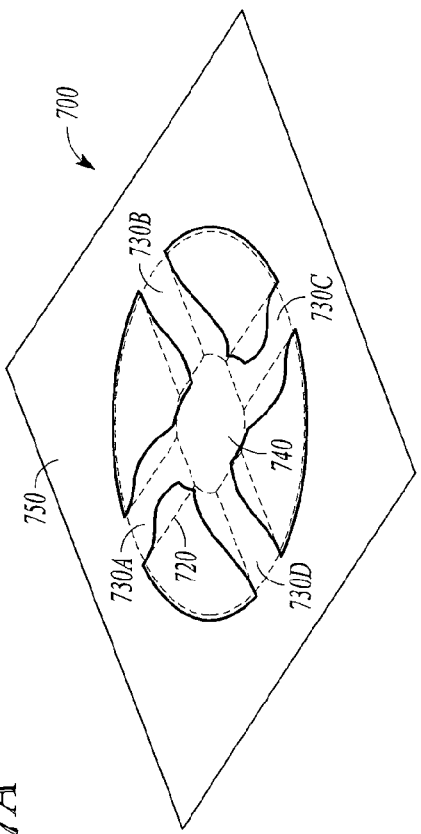
FIG. 7 illustrates generally an example that can include a sensor region and one or more actuators tethering the sensor region to an anchor region.
Figure 7A:
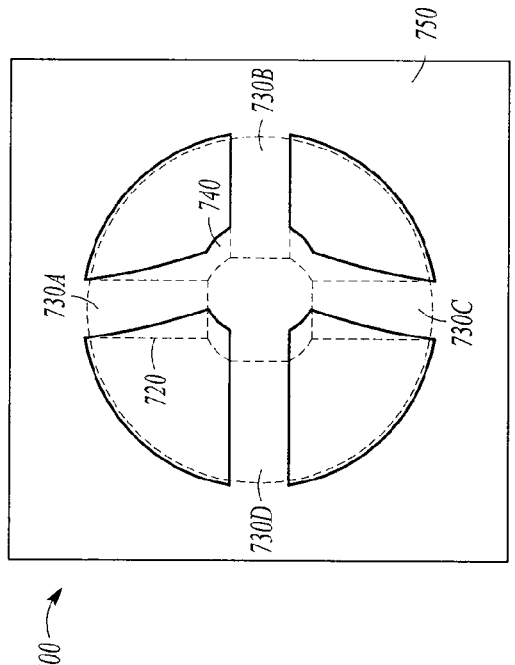
Figure 7B:
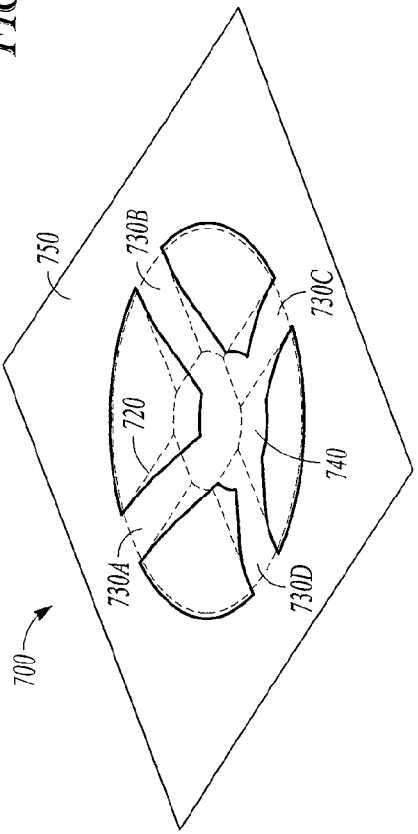

FIG. 7 illustrates generally an example of an apparatus 700 that can include a sensor region 740 and one or more actuators tethering the sensor region to an anchor region 750. The present inventors have recognized, among other things, that a unimorph or bimorph actuator, such as including one or more co-integrated electrical devices, can be used to position a platform. In the example of FIGS. 7A through 7C, a sensor region 740 can include one or more of an acoustic sensor, an optical sensor, a chemical sensor, or one or more other devices, such as bonded or co-integrated with a dielectric substrate comprising the apparatus 700. For example, such a dielectric can include an electrostrictive material as discussed in the examples above and below, such as including PVDF-TrFE-CFE terpolymer. The sensor region 740 can be tethered to the anchor region 750 such as via one or more of a first actuator region 730A, a second actuator region 730B, a third actuator region 730C, or a fourth actuator region 730D.

As shown in the illustrative examples of FIGS. 7A through 7C, such actuators can be used to translate the sensor region. For example, in FIG. 7A, such translation can be in-plane in an X-direction, or in FIG. 7B, in a Z-direction, such as away from a relaxed position 720. Such a sensor region 740 can also be rotated or tilted, such as shown in the example of FIG. 7C. Combinations of such translation or rotation can also be used, such as to tilt or otherwise orient the sensor region 740 in a desired position or orientation. An array of such sensors, such as including two or more positionable platforms each comprising the apparatus 700 of FIGS. 7A through 7C, could be used to point, align, or focus one or more sensor regions on a desired target.

A computational simulation of the apparatus 700 of the examples of FIGS. 7A through 7C, such as including a bimorph actuator configuration for the respective actuator regions 730A through 730D, including a stackup similar to the examples of FIGS. 2A and 2B, can provide a simulated Z-displacement of about 5 millimeters (mm) or more, a simulated x-displacement of about 40 μm or more, or a tilt of 20 degrees or more.

Figure 8:
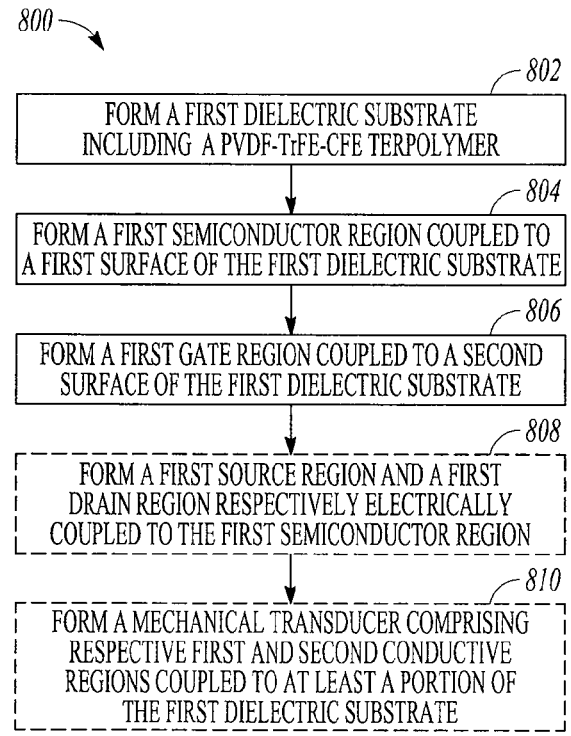
FIG. 8 illustrates generally a technique, such as a method, that can include forming an OFET.

FIG. 8 illustrates generally a technique 800, such as a method, that can include forming an OFET, such as discussed in one or more examples above or below. At 802, a first dielectric substrate can be formed, such as including a PVDF-TrFe-CFE terpolymer, or one or more other electrostrictive materials. At 804, a first semiconductor region can be coupled to a first surface of the first dielectric substrate, such as using one or more of sputtering, chemical vapor deposition, evaporative deposition, or one or more other processing techniques. At 806, a first gate region can be formed, such as coupled to a second surface of the first dielectric substrate. In this manner, the dielectric substrate can provide a gate dielectric, and a mechanical support for a transistor structure.

In an example, at 808, a first source region and a first drain region can be respectively electrically coupled to the semiconductor region, such as to provide the transistor structure, which can be controlled by the gate. In an example, at 810, a mechanical transducer can be formed, such as including at least a portion of the dielectric substrate. Forming the mechanical transducer can include forming a first conductive region on the first surface of the dielectric substrate, and forming a corresponding second conductive region on the second surface of the dielectric substrate opposite the first surface.

The technique 800 of FIG. 8 can be used, at least in part, such as to provide an OFET and mechanical transducer (e.g., a mechanical actuator or a mechanical sensor), such as co-integrated using a commonly-shared electrostrictive dielectric substrate, such as configured as described in one or more of the examples of FIGS. 1A, 1B, 2A, 2B, 3, 4A through 4C, 5A through 5F, 6A through 6F, 7A through 7C, or as described in the examples below.

Figure 9:
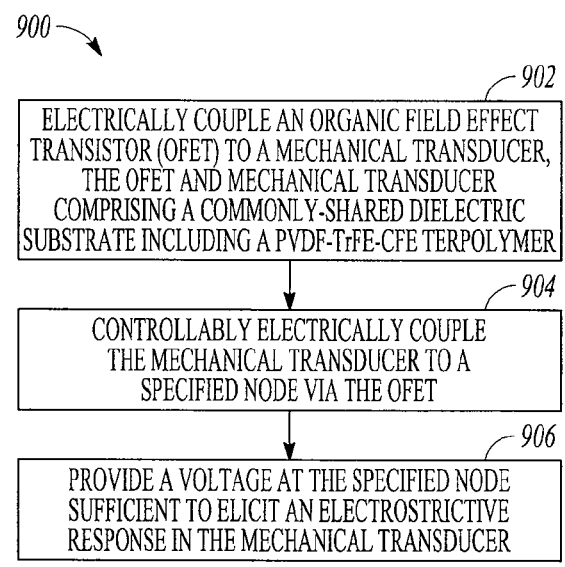
FIG. 9 illustrates generally a technique, such as a method, that can include controllably positioning a sensor region using an electrostrictive actuator.

FIG. 9 illustrates generally a technique 900, such as a method, that can include controllably positioning a sensor region using an electrostrictive actuator, such as discussed in the examples of FIGS. 7A through 7C. A 902, an OFET can be coupled to a mechanical transducer, the OFET and mechanical transducer comprising a commonly-shared dielectric substrate, such as including an electrostrictive material (e.g., PVDF-TrFE-CFE). At 904, the mechanical transducer can be controllably electrically coupled to a specified node. At 906, a specified voltage can be provided at the node, such as to induce a strain in a portion of the dielectric substrate via electrostriction.

Various Notes & Examples

Example 1 can include or use subject matter (such as an apparatus, a method, a means for performing acts, or a device readable medium including instructions that, when performed by the device, can cause the device to perform acts), such as can include a first dielectric substrate including a PVDF-TrFe-CFE terpolymer, a first semiconductor region coupled to a first surface of the first dielectric substrate, and a first gate region coupled to a second surface of the first dielectric substrate, the second surface opposite the first surface and opposite the first semiconductor region.

Example 2 can include, or can optionally be combined with the subject matter of Example 1, to optionally include a first source region and a first drain region respectively electrically coupled to the first semiconductor region, and wherein the first dielectric substrate, the first semiconductor region, the first source region, the first drain region, and the first gate region comprise a first field-effect transistor having a first conductivity type.

Example 3 can include, or can optionally be combined with the subject matter of one or any combination of Examples 1 or 2 to optionally include a second semiconductor region coupled to the first dielectric substrate, a second gate region coupled to a second surface of the first dielectric substrate, a second source region and a second drain region coupled to the second semiconductor region, the first dielectric substrate, the second semiconductor region, the second source region, the second drain region, and the second gate region comprising a second field-effect transistor having a second conductivity type.

Example 4 can include, or can optionally be combined with the subject matter of Example 3 to optionally include a first semiconductor region including pentacene, the first field-effect transistor includes a p-channel conductivity type, the second semiconductor region including $F_{16}CuPC$, and the second field-effect transistor including an n-channel conductivity type.

Example 5 can include, or can optionally be combined with the subject matter of one or any combination of Examples 3 or 4 to optionally include a second dielectric substrate including a PVDF-TrFe-CFE terpolymer, a third field-effect transistor having the first conductivity type, the third field effect transistor including a third semiconductor region coupled to the second dielectric substrate, a fourth field-effect transistor having the second conductivity type, the fourth field effect transistor including a fourth semiconductor region coupled to the second dielectric substrate, the second dielectric substrate coupled to the first dielectric substrate.

Example 6 can include, or can optionally be combined with the subject matter of Example 5 to optionally include one or more of an electrostrictive actuator, or a mechanical sensor, comprising first and second conductive regions located on opposite surfaces of a portion of the first dielectric substrate, third and fourth conductive regions located on opposite surfaces of a portion of the second dielectric substrate, the first and second field-effect transistors comprising a first complementary transistor pair configured to selectively electrically couple the first conductive region to a first specified node, the third and fourth field-effect transistors comprising a second complementary transistor pair configured to selectively electrically couple the fourth conductive region to a second specified node, the second and third conductive regions electrically coupled to each other.

Example 7 can include, or can optionally be combined with the subject matter of one or any combination of Examples 3 through 6 to optionally include first and second conductive regions located on opposite surfaces of the first dielectric substrate, the first and second conductive regions and at least a portion of the first dielectric substrate comprising one or more of an electrostrictive actuator, or a mechanical sensor, and the first and second field-effect transistors comprising a first complementary transistor pair configured to selectively electrically couple the first conductive region to a first specified node.

Example 8 can include, or can optionally be combined with the subject matter of Example 7 to optionally include one or more of the electrostrictive actuator or the mechanical sensor comprising a unimorph configuration.

Example 9 can include, or can optionally be combined with the subject matter of one or any combination of Examples 7 or 8 to optionally include first and second conductive regions, at least a portion of the first dielectric substrate comprising a first electrostrictive actuator, the apparatus including a sensor region coupled to the electrostrictive actuator, and the electrostrictive actuator configured to one or more of controllably rotate, controllably translate, or controllably tilt the sensor region using the first complementary transistor pair.

Example 10 can include, or can optionally be combined with the subject matter of Example 9 to optionally include respective second, third, and fourth actuators electrically coupled to respective second, third, and fourth complementary field-effect transistor pairs, the sensor region tethered to an anchoring region via the respective first, second, third, and fourth actuators, and the first, second, third, and fourth actuators configured to cooperatively controllably rotate, controllably translate, or controllably tilt the sensor region using the respective first, second, third, and fourth complementary field-effect transistor pairs.

Example 11 can include, or can optionally be combined with the subject matter of one or any combination of Examples 1 through 10 to optionally include a second dielectric substrate mechanically coupled to the first dielectric substrate.

Example 12 can include, or can optionally be combined with the subject matter of Example 11 to optionally include a second dielectric substrate comprising a PVDF-TrFe-CFE terpolymer, and Example 12 can include a second semiconductor region coupled to a first surface of the second dielectric substrate, and a second gate region coupled to a second surface of the second dielectric substrate, the second surface opposite the first surface and opposite the second semiconductor region.

Example 13 can include, or can optionally be combined with the subject matter of one or any combination of Examples 1-12 to include, subject matter (such as an apparatus, a method, a means for performing acts, or a machine readable medium including instructions that, when performed by the machine, that can cause the machine to perform acts), such as can include an integrated transducer assembly, comprising a first dielectric substrate including a PVDF-TrFe-CFE terpolymer, a first semiconductor region coupled to a first surface of the first dielectric substrate, a first gate region coupled to a second surface of the first dielectric substrate, the second surface opposite the first surface and opposite the first semiconductor region, a first source region and a first drain region respectively electrically coupled to the first semiconductor region, and wherein the first dielectric substrate, the first semiconductor region, the first source region, the first drain region, and the first gate region comprise a first field-effect transistor having a first conductivity type, a second semiconductor region coupled to the first dielectric substrate, a second gate region coupled to a second surface of the first dielectric substrate, a second source region and a second drain region coupled to the second semiconductor region, and wherein the first dielectric substrate, the second semiconductor region, the second source region, the second drain region, and the second gate region comprise a second field-effect transistor having a second conductivity type, first and second conductive regions located on opposite surfaces of the first dielectric substrate, the first and second conductive regions and at least a portion of the first dielectric substrate comprising one or more of an electrostrictive actuator, or a mechanical sensor, the first and second field-effect transistors comprising a first complementary transistor pair configured to selectively electrically couple the first conductive region to a first specified node.

Example 14 can include, or can optionally be combined with the subject matter of one or any combination of Examples 1-13 to include, subject matter (such as an apparatus, a method, a means for performing acts, or a machine readable medium including instructions that, when performed by the machine, that can cause the machine to perform acts), such as can include forming a first dielectric substrate including a PVDF-TrFe-CFE terpolymer, forming a first semiconductor region coupled to a first surface of the first dielectric substrate, and forming a first gate region coupled to a second surface of the first dielectric substrate, the second surface opposite the first surface and opposite the first semiconductor region.

Example 15 can include, or can optionally be combined with the subject matter of Example 14 to optionally include forming a first source region and a first drain region respectively electrically coupled to the first semiconductor region, and wherein the first dielectric substrate, the first semiconductor region, the first source region, the first drain region, and the first gate region comprise a first field-effect transistor having a first conductivity type.

Example 16 can include, or can optionally be combined with the subject matter of Example 15 to optionally include forming a second semiconductor region coupled to the first dielectric substrate, forming a second gate region coupled to a second surface of the first dielectric substrate, forming a second source region and a second drain region coupled to the second semiconductor region, and wherein the first dielectric substrate, the second semiconductor region, the second source region, the second drain region, and the second gate region comprise a second field-effect transistor having a second conductivity type.

Example 17 can include, or can optionally be combined with the subject matter of Example 16 to optionally include a first semiconductor region comprising pentacene, the first field-effect transistor including a p-channel conductivity type, wherein the second semiconductor region comprising $F_{16}CuPC$, the second field-effect transistor including an n-channel conductivity type.

Example 18 can include, or can optionally be combined with the subject matter of one or any combination of Examples 14 through 17 to optionally include forming a second dielectric substrate including a PVDF-TrFe-CFE terpolymer, forming a third field-effect transistor having the first conductivity type, the third field effect transistor including a third semiconductor region coupled to the second dielectric substrate, forming a fourth field-effect transistor having the second conductivity type, the fourth field effect transistor including a fourth semiconductor region coupled to the second dielectric substrate, and coupling the first dielectric substrate to the second dielectric substrate.

Example 19 can include, or can optionally be combined with the subject matter of Example 18 to optionally include forming one or more of an electrostrictive actuator, or a mechanical sensor, comprising forming first and second conductive regions located on opposite surfaces of a portion of the first dielectric substrate, forming third and fourth conductive regions located on opposite surfaces of a portion of the second dielectric substrate, electrically coupling the second and third conductive regions to each other, the first and second field-effect transistors comprising a first complementary transistor pair configured to selectively electrically couple the first conductive region to a first specified node, and the third and fourth field-effect transistors comprising a second complementary transistor pair configured to selectively electrically couple the fourth conductive region to a second specified node.

Example 20 can include, or can optionally be combined with the subject matter of one or any combination of Examples 16 through 19 to optionally include forming first and second conductive regions located on opposite surfaces of the first dielectric substrate, the first and second conductive regions and at least a portion of the first dielectric substrate comprising one or more of an electrostrictive actuator, or a mechanical sensor, and the first and second field-effect transistors comprising a first complementary transistor pair configured to selectively electrically couple the first conductive region to a first specified node.

Example 21 can include, or can optionally be combined with the subject matter of Example 20 to optionally include forming an electrostrictive actuator comprising first and second conductive regions and the at least a portion of the first dielectric substrate, and forming a sensor region coupled to the electrostrictive actuator, the electrostrictive actuator configured to one or more of controllably rotate, controllably translate, or controllably tilt the sensor region using the first complementary transistor pair.

Example 22 can include, or can optionally be combined with the subject matter of Example 21 to optionally include forming respective second, third, and fourth complementary field-effect transistor pairs, forming respective second, third, and fourth actuators electrically coupled to the respective second, third, and fourth complementary field-effect transistor pairs, the sensor region tethered to an anchoring region via the respective first, second, third, and fourth actuators, the first, second, third, and fourth actuators configured to cooperatively controllably rotate, controllably translate, or controllably tilt the sensor region using the respective first, second, third, and fourth complementary field-effect transistor pairs.

Example 23 can include, or can optionally be combined with any portion or combination of any portions of any one or more of Examples 1-22 to include, subject matter that can include means for performing any one or more of the functions of Examples 1-22, or a machine-readable medium including instructions that, when performed by a machine, cause the machine to perform any one or more of the functions of Examples 1-22.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An apparatus, comprising:
a first dielectric substrate including a PVDF-TrFe-CFE terpolymer;
a first semiconductor region coupled to a first surface of the first dielectric substrate;
a first gate region coupled to a second surface of the first dielectric substrate, the second surface opposite the first surface and opposite the first semiconductor region;
a first source region and a first drain region respectively electrically coupled to the first semiconductor region, wherein the first dielectric substrate, the first semiconductor region, the first source region, the first drain region, and the first gate region comprise a first field-effect transistor having a first conductivity type; and
one or more of an electrostrictive actuator or a mechanical sensor, comprising first and second conductive regions located on opposite surfaces of a portion of the first dielectric substrate, wherein at least one of the first or second conductive regions is coupled to the first field effect transistor.

2. The apparatus of claim 1, comprising:
a second semiconductor region coupled to the first dielectric substrate;
a second gate region coupled to a second surface of the first dielectric substrate;
a second source region and a second drain region coupled to the second semiconductor region, and wherein the first dielectric substrate, the second semiconductor region, the second source region, the second drain region, and the second gate region comprise a second field-effect transistor having a second conductivity type.

3. The apparatus of claim 2, wherein the first semiconductor region includes pentacene, wherein the first field-effect transistor includes a p-channel conductivity type, wherein the second semiconductor region includes $F_{16}CuPC$, and wherein the second field-effect transistor includes an n-channel conductivity type.

4. The apparatus of claim 2, comprising:
a second dielectric substrate including a PVDF-TrFe-CFE terpolymer;
a third field-effect transistor having the first conductivity type, the third field effect transistor including a third semiconductor region coupled to the second dielectric substrate; and
a fourth field-effect transistor having the second conductivity type, the fourth field effect transistor including a fourth semiconductor region coupled to the second dielectric substrate; and
wherein the second dielectric substrate is coupled to the first dielectric substrate.

5. The apparatus of claim 4 wherein the one or more of the electrostrictive actuator or the mechanical sensor includes:
third and fourth conductive regions located on opposite surfaces of a portion of the second dielectric substrate;
wherein the first and second field-effect transistors comprise a first complementary transistor pair coupled to the first conductive region;
wherein the third and fourth field-effect transistors comprise a second complementary transistor pair coupled to the fourth conductive region; and
wherein the second and third conductive regions are electrically coupled to each other.

6. The apparatus of claim 2,
wherein the first and second field-effect transistors comprise a first complementary transistor pair coupled to the first conductive region.

7. The apparatus of claim 6, wherein the first and second conductive regions and the at least a portion of the first dielectric substrate comprise a first electrostrictive actuator;
wherein the apparatus includes a sensor region coupled to the electrostrictive actuator; and
wherein the electrostrictive actuator is configured to one or more of controllably rotate, controllably translate, or controllably tilt the sensor region using the first complementary transistor pair.

8. The apparatus of claim 7, comprising respective second, third, and fourth actuators electrically coupled to respective second, third, and fourth complementary field-effect transistor pairs;
wherein the sensor region is tethered to an anchoring region via the respective first, second, third, and fourth actuators; and
wherein the first, second, third, and fourth actuators are configured to cooperatively controllably rotate, controllably translate, or controllably tilt the sensor region using the respective first, second, third, and fourth complementary field-effect transistor pairs.

9. The apparatus of claim 1 wherein the one or more of the electrostrictive actuator or the mechanical sensor includes a unimorph configuration.

10. The apparatus of claim 1, comprising a second dielectric substrate mechanically coupled to the first dielectric substrate.

11. The apparatus of claim 10, wherein the second dielectric substrate comprises a PVDF-TrFe-CFE terpolymer; and
wherein the apparatus includes:
a second semiconductor region coupled to a first surface of the second dielectric substrate; and
a second gate region coupled to a second surface of the second dielectric substrate, the second surface opposite the first surface and opposite the second semiconductor region.

12. An integrated transducer assembly, comprising:
a first dielectric substrate including a PVDF-TrFe-CFE terpolymer;
a first semiconductor region coupled to a first surface of the first dielectric substrate;
a first gate region coupled to a second surface of the first dielectric substrate, the second surface opposite the first surface and opposite the first semiconductor region;
a first source region and a first drain region respectively electrically coupled to the first semiconductor region, and wherein the first dielectric substrate, the first semiconductor region, the first source region, the first drain region, and the first gate region comprise a first field-effect transistor having a first conductivity type;
a second semiconductor region coupled to the first dielectric substrate;
a second gate region coupled to a second surface of the first dielectric substrate;
a second source region and a second drain region coupled to the second semiconductor region, and wherein the first dielectric substrate, the second semiconductor region, the second source region, the second drain region, and the second gate region comprise a second field-effect transistor having a second conductivity type; and
first and second conductive regions located on opposite surfaces of the first dielectric substrate, the first and second conductive regions and at least a portion of the first dielectric substrate comprising one or more of an electrostrictive actuator, or a mechanical sensor;
wherein the first and second field-effect transistors comprise a first complementary transistor pair coupled to the first conductive region.

13. A method, comprising:
forming a first dielectric substrate including a PVDF-TrFe-CFE terpolymer;
forming a first semiconductor region coupled to a first surface of the first dielectric substrate; and
forming a first gate region coupled to a second surface of the first dielectric substrate, the second surface opposite the first surface and opposite the first semiconductor region;
forming a first source region and a first drain region respectively electrically coupled to the first semiconductor region, and wherein the first dielectric substrate, the first semiconductor region, the first source region, the first drain region, and the first gate region comprise a first field-effect transistor having a first conductivity type; and
forming first and second conductive regions located on opposite surfaces of the first dielectric substrate;
wherein the first and second conductive regions and at least a portion of the first dielectric substrate comprise one or more of an electrostrictive actuator or a mechanical sensor; and
wherein at least one of the first or second conductive regions is coupled to the first field-effect transistor.

14. The method of claim 13, comprising:
forming a second semiconductor region coupled to the first dielectric substrate;
forming a second gate region coupled to a second surface of the first dielectric substrate;
forming a second source region and a second drain region coupled to the second semiconductor region, and wherein the first dielectric substrate, the second semiconductor region, the second source region, the second drain region, and the second gate region comprise a second field-effect transistor having a second conductivity type.

15. The method of claim 14, wherein the first semiconductor region includes pentacene, wherein the first field-effect transistor includes a p-channel conductivity type, wherein the second semiconductor region includes $F_{16}CuPC$, and wherein the second field-effect transistor includes an n-channel conductivity type.

16. The method of claim 14, comprising:
forming a second dielectric substrate including a PVDF-TrFe-CFE terpolymer;
forming a third field-effect transistor having the first conductivity type, the third field effect transistor including a third semiconductor region coupled to the second dielectric substrate; and
forming a fourth field-effect transistor having the second conductivity type, the fourth field effect transistor including a fourth semiconductor region coupled to the second dielectric substrate; and
coupling the first dielectric substrate to the second dielectric substrate.

17. The method of claim 16, comprising:
forming third and fourth conductive regions located on opposite surfaces of a portion of the second dielectric substrate;
electrically coupling the second and third conductive regions to each other;
wherein the first and second field-effect transistors comprise a first complementary transistor pair coupled to the first conductive region; and
wherein the third and fourth field-effect transistors comprise a second complementary transistor pair coupled to the second conductive region; and
wherein the one or more of the electrostrictive actuator or the mechanical sensor includes the third and fourth conductive regions located on opposite surfaces of the portion of the second dielectric substrate.

18. The method of claim 14, comprising:
wherein the first and second field-effect transistors comprise a first complementary transistor pair coupled to the first conductive region.

19. The method of claim 18,
wherein the electrostrictive actuator comprises the first and the second conductive regions and the at least a portion of the first dielectric substrate;
wherein the method includes forming a sensor region coupled to the electrostrictive actuator; and
wherein the electrostrictive actuator is configured to one or more of controllably rotate, controllably translate, or controllably tilt the sensor region using the first complementary transistor pair.

20. The method of claim 19, comprising:
forming respective second, third, and fourth complementary field-effect transistor pairs;
forming respective second, third, and fourth actuators electrically coupled to the respective second, third, and fourth complementary field-effect transistor pairs;
wherein the sensor region is tethered to an anchoring region via the respective first, second, third, and fourth actuators; and
wherein the first, second, third, and fourth actuators are configured to cooperatively controllably rotate, controllably translate, or controllably tilt the sensor region using the respective first, second, third, and fourth complementary field-effect transistor pairs.

* * * * *